United States Patent
Chen

(10) Patent No.: US 8,421,095 B2
(45) Date of Patent: *Apr. 16, 2013

(54) LIGHT-EMITTING DIODE ARRAY

(75) Inventor: Chao-Hsing Chen, Hsinchu (TW)

(73) Assignee: Epistar Corporation, Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 13/341,414

(22) Filed: Dec. 30, 2011

(65) Prior Publication Data

US 2012/0097995 A1    Apr. 26, 2012

Related U.S. Application Data

(62) Division of application No. 12/961,859, filed on Dec. 7, 2010, now Pat. No. 8,110,420.

(30) Foreign Application Priority Data

Dec. 7, 2009   (TW) ................. 98141859 A

(51) Int. Cl.
*H01L 29/06* (2006.01)
*H01L 27/15* (2006.01)
*H01L 29/18* (2006.01)
*H01L 33/00* (2010.01)

(52) U.S. Cl.
USPC .............. 257/88; 257/13; 257/79; 257/84; 257/113; 257/146; 257/E21.024; 257/E21.053; 257/E21.336; 257/E21.527; 257/E21.542

(58) Field of Classification Search ........... 257/E21.024, 257/E21.542, E21.697, E21.053, E21.336, 257/E21.527

See application file for complete search history.

(56) References Cited

U.S. PATENT DOCUMENTS

| | | | |
|---|---|---|---|
| 6,730,936 B2 | 5/2004 | Yukimoto | |
| 6,998,642 B2 | 2/2006 | Lin et al. | |
| 7,504,772 B2 * | 3/2009 | Yukimoto et al. | 313/506 |
| 7,888,690 B2 * | 2/2011 | Iwafuchi et al. | 257/89 |
| 2003/0010989 A1 * | 1/2003 | Yukimoto | 257/88 |
| 2003/0132447 A1 | 7/2003 | Yukimoto | |
| 2005/0029529 A1 * | 2/2005 | Yukimoto et al. | 257/79 |
| 2005/0224822 A1 | 10/2005 | Liu | |
| 2008/0157097 A1 | 7/2008 | Kuo et al. | |
| 2008/0310471 A1 * | 12/2008 | Bessho et al. | 372/44.01 |
| 2010/0032690 A1 * | 2/2010 | Feng et al. | 257/88 |
| 2010/0258822 A1 * | 10/2010 | Kobayashi | 257/88 |
| 2011/0062456 A1 * | 3/2011 | Chen et al. | 257/88 |
| 2011/0062457 A1 * | 3/2011 | Naito et al. | 257/88 |
| 2011/0062891 A1 * | 3/2011 | Chen et al. | 315/294 |
| 2011/0121329 A1 * | 5/2011 | Chen et al. | 257/91 |
| 2011/0312113 A1 * | 12/2011 | Kuo et al. | 438/29 |

* cited by examiner

*Primary Examiner* — Mohsen Ahmadi
(74) *Attorney, Agent, or Firm* — Patterson & Sheridan, LLP

(57) ABSTRACT

A method of fabricating a light emitting diode array, comprising: providing a temporary substrate; forming a first light emitting stack and a second light emitting stack on the temporary substrate; forming a first insulating layer covering partial of the first light emitting stack; forming a wire on the first insulating layer and electrically connecting to the first light emitting stack and the second light emitting stack; forming a second insulating layer fully covering the first light emitting stack, the wire and partial of the second light emitting stack; forming a metal connecting layer on the second insulating layer and electrically connecting to the second light emitting stack; forming a conductive substrate on the metal connecting layer; removing the temporary substrate; and forming a first electrode connecting to the first light emitting stack.

19 Claims, 11 Drawing Sheets

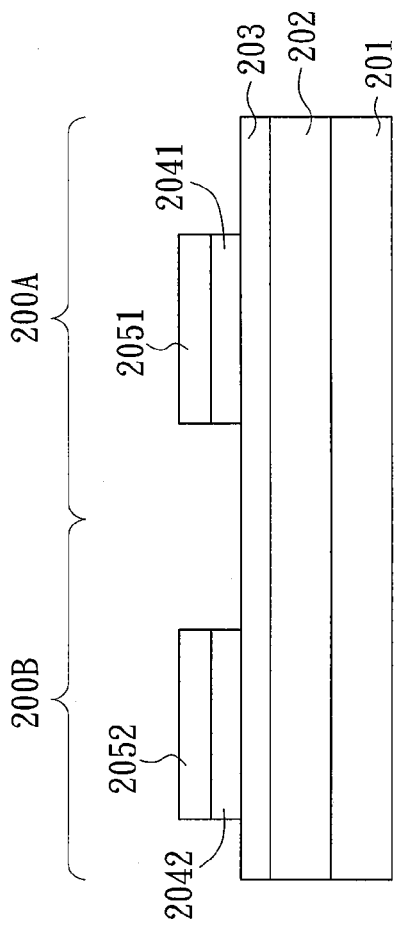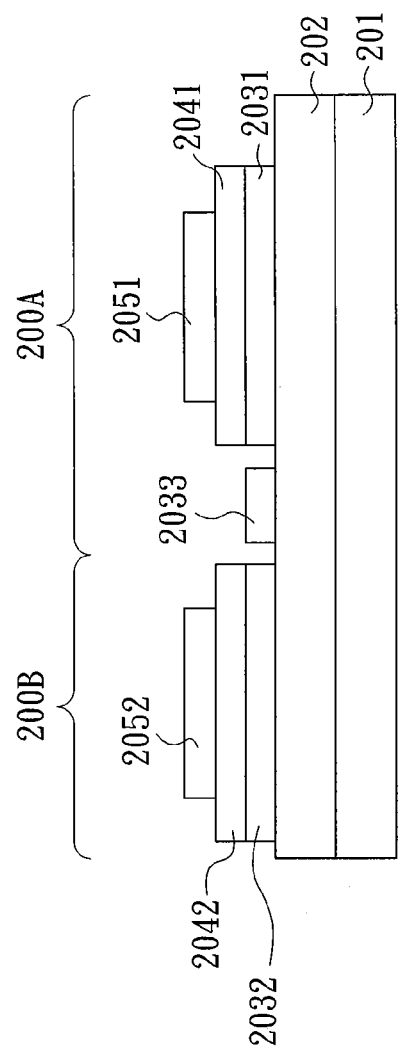
FIG. 2A
FIG. 2B

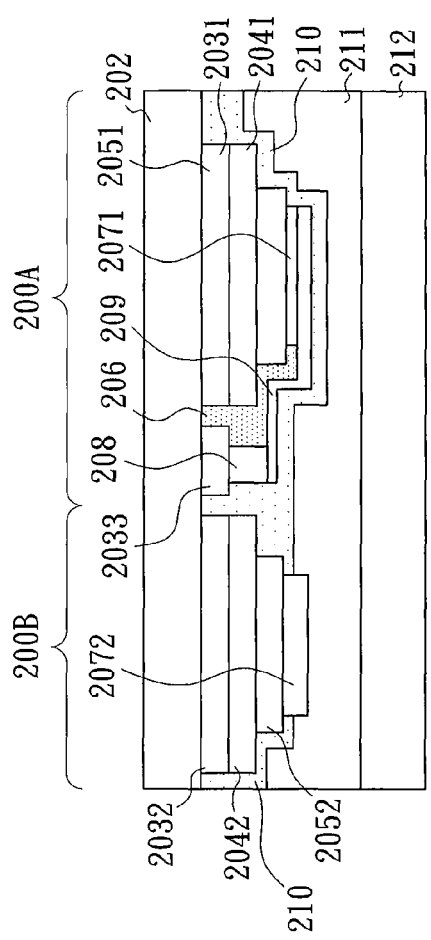
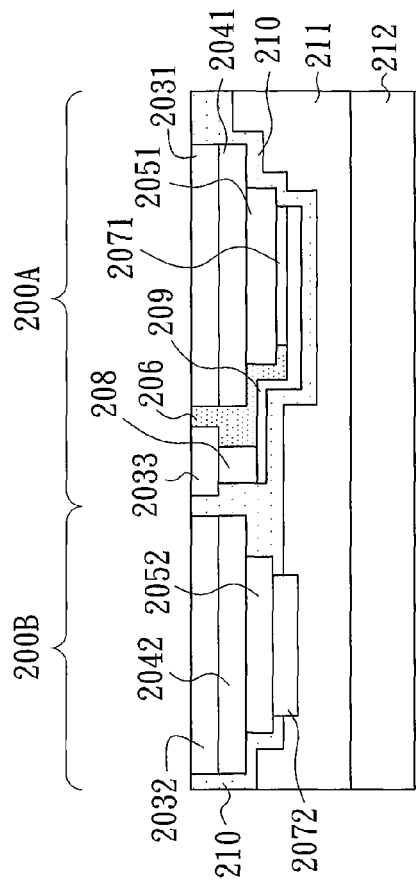
FIG. 2G
FIG. 2H

LIGHT-EMITTING DIODE ARRAY

RELATED APPLICATION

This application is a divisional application of U.S. patent application Ser. No. 12/961,859, entitled "Light Emitting Element Array", filed Dec. 7, 2010 now U.S. Pat. No. 8,110,420, which claims the priority to and the benefit of TW application Ser. No. 098141859 filed on Dec. 7, 2009; the contents of which are incorporated herein by reference in their entirety.

BACKGROUND

1. Technical Field

The present disclosure disclosed a light emitting diode array structure and its fabricating method thereof.

2. Description of the Related Art

The light radiation theory of light emitting diode (LED) is when electrons move between an n-type semiconductor and a p-type semiconductor, the electron energy difference caused by different band energy between the n and p type semiconductors is released and accompanied by generation of photons. Because the light radiation theory of LED is different from the incandescent light which is through the heating of filament, the LED is also called a "cold" light source. Moreover, the LED is also more sustainable, longevous, light and handy, and less power-consumption, therefore it is considered a new generation product in the lighting markets.

FIG. 1 illustrates the structure of a conventional light emitting array, which includes a sapphire substrate 101, a plurality of light emitting stacks 100 formed above the sapphire substrate 101, and a buffer layer formed between the sapphire substrate 101 and the light emitting stack 100 optionally. Each light emitting stack 100 comprises an n-type semiconductor layer 103, an active layer 104, and a p-type semiconductor layer 105. Because the sapphire substrate 101 is not conductive, the plurality of light emitting stacks 100 is divided by the trenches etched from the light emitting stack 100 to the sapphire substrate 101 and covered by an insulating layer 108. Besides, partial of the plurality of the light emitting stacks 100 is etched to expose the n-type semiconductor layer 103. A first connecting electrode 106 and a second connecting electrode 107 are formed on the exposed n-type semiconductor layer 103 and the p-type semiconductor layer 105. The plurality of light emitting stacks 100 is parallely connected through wires 109, the first connecting electrode 106 and the second connecting electrode 107.

The parallely connected structure as illustrated in FIG. 1 is a horizontal electrical structure wherein the wires are electrically connected on the same side of the substrate and the current passes the semiconductor layer laterally. But because of the poor lateral conductivity of the p-type semiconductor is poor, the structure turns to be an n-side up structure. To form the n-side up structure, the sapphire substrate should be polished or lift-off by laser which damages the electrical connection and makes the fabricating process complicated.

SUMMARY OF THE DISCLOSURE

A method of fabricating a light emitting diode array, comprising: providing a temporary substrate; forming a first light emitting stack and a second light emitting stack on the temporary substrate; forming a first insulating layer covering partial of the first light emitting stack; forming a wire on the first insulating layer and electrically connecting to the first light emitting stack and the second light emitting stack; forming a second insulating layer fully covering the first light emitting stack, the wire and partial of the second light emitting stack; forming a metal connecting layer on the second insulating layer and electrically connecting to the second light emitting stack; forming a conductive substrate on the metal connecting layer; removing the temporary substrate; and forming a first electrode connecting to the first light emitting stack.

BRIEF DESCRIPTION OF DRAWINGS

The accompanying drawings are included to provide easy understanding of the disclosure, and are incorporated herein and constitute as part of this specification. The drawings illustrate embodiments of the disclosure and, together with the description, serve to illustrate the principles of the disclosure.

FIGS. 2A to 2K illustrate a process flow of a method of fabricating a light emitting diode array in one embodiment of the present disclosure.

DETAILED DESCRIPTION

Figure 1:
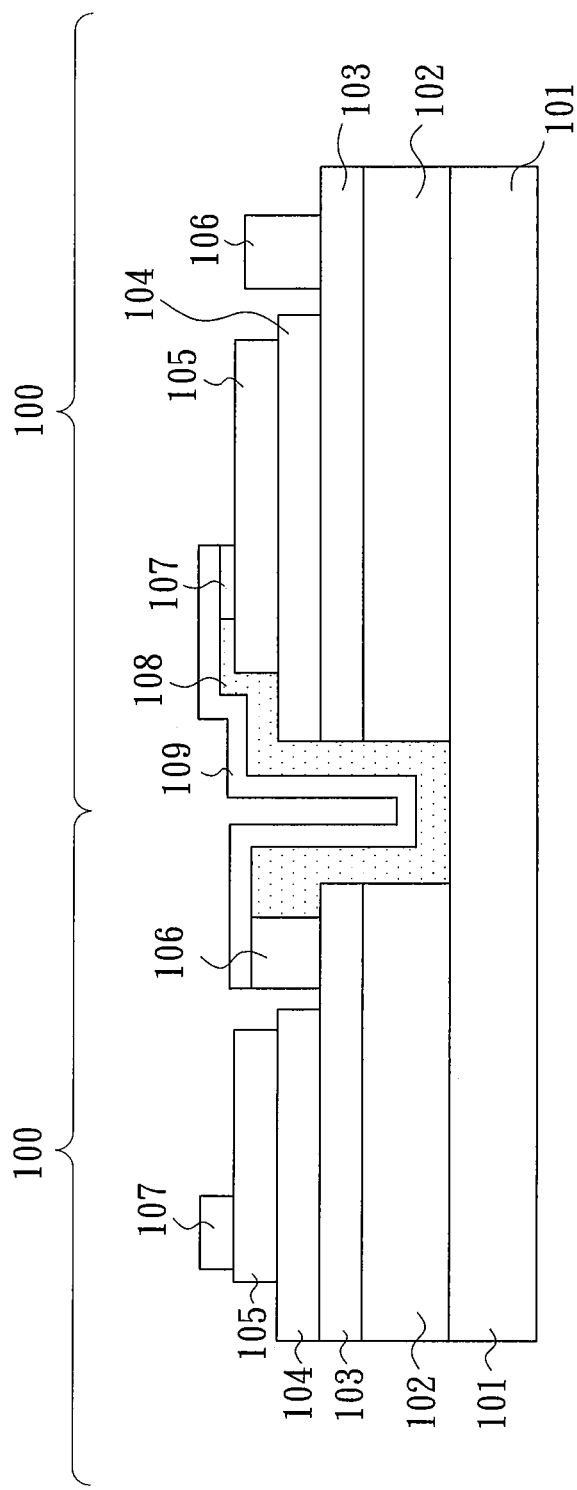
FIG. 1 illustrates the structure of a conventional light emitting array.

Reference is made in detail to the preferred embodiments of the present disclosure, examples of which are illustrated in the accompanying drawings. Wherever possible, the same reference numbers are used in the drawings and the description to refer to the same or like parts.

The present disclosure describes a light emitting diode array and a method of fabricating the light emitting diode array. In order to have a thorough understanding of the present disclosure, please refer to the following description and the illustrations FIG. 2A to FIG. 4.

Figure 2C:
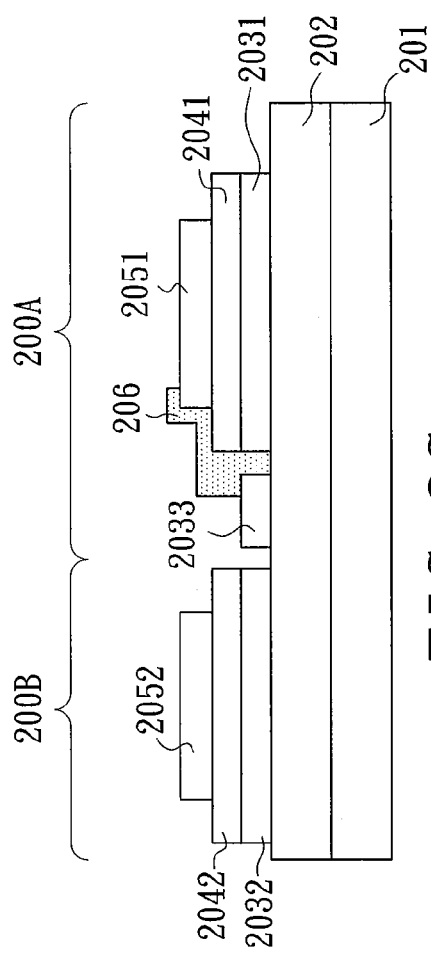

FIGS. 2A to 2K illustrate a process flow of the method of fabricating. FIG. 2A shows a temporary substrate 201, a plurality of first light emitting stacks 200A and a plurality of second light emitting stacks 200B wherein the plurality of first light emitting stacks 200A and the plurality of second light emitting stacks 200B are alternately formed on the temporary substrate 201. Each first light emitting stack 200A includes an n-type semiconductor layer 203 formed on the temporary substrate 201, a first active layer 2041 formed on the n-type semiconductor layer 203 and a first p-type semiconductor layer 2051 formed on the first active layer 2041. Each second light emitting stack layer 200B includes an n-type semiconductor layer 203 formed on the temporary substrate 201, a second active layer 2042 formed on the n-type semiconductor layer 203 and a second p-type semiconductor layer 2052 formed on the second active layer 2042. Besides, a buffer layer 202 is formed between the temporary substrate 201 and the n-type semiconductor layer 203 optionally.

Following, as FIG. 2B shows, partial of the n-type semiconductor layer 203 of the first light emitting stack 200A and the second light emitting stack 200B is etched to expose the buffer layer 202 or the temporary substrate 201. The n-type semiconductor layer 203 is divided into a first n-type semiconductor layer 2031, a second n-type semiconductor layer 2032 and a third n-type semiconductor layer 2033 in an island shape. The first light emitting stack 200A includes the first n-type semiconductor layer 2031, a third n-type semiconductor layer 2033, a first active layer 2041 and the first p-type semiconductor layer 2051. The second light emitting stack 200B includes the second n-type semiconductor layer 2032, a second active layer 2042 and the second p-type semiconductor layer 2052.

Following, as FIG. 2C shows, a first insulating layer 206 is formed to cover the trench between the third n-type semiconductor layer 2033 and the first p-type semiconductor layer 2051.

Figure 2D:
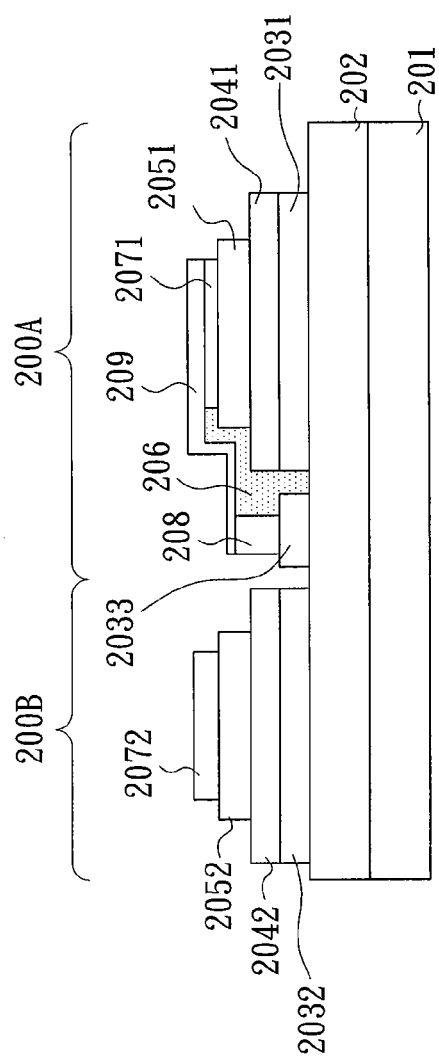

Following, as FIG. 2D shows, a first p-type electrode 2071 and a second p-type electrode 2072 is formed on the first p-type semiconductor layer 2051 and the second p-type semiconductor layer 2052 respectively. A first n-type electrode 208 is formed on the third n-type semiconductor layer 2033, and the first p-type electrode 2071 and the first n-type electrode 208 is electrically connected by a wire 209 to make the current flows from the first p-type electrode 2071 to the first n-type electrode 208.

Figure 2E:
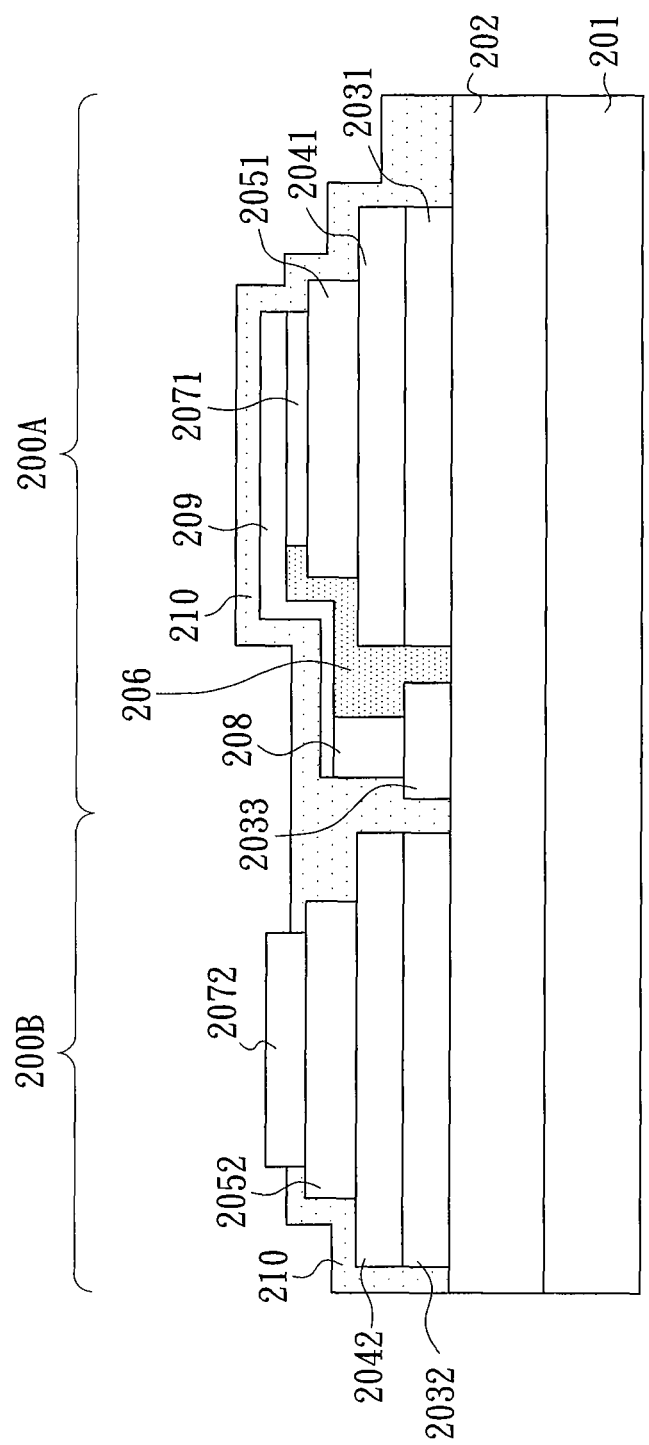

Following, as FIG. 2E shows, a second insulating layer 210 is formed on the first light emitting stack 200A and the second light emitting stack 200B wherein the first light emitting stack 200A is covered by the second insulating layer 210 and the second p-type electrode 2072 of the second light emitting stack 200B is not covered by the second insulating layer 210.

Figure 2F:
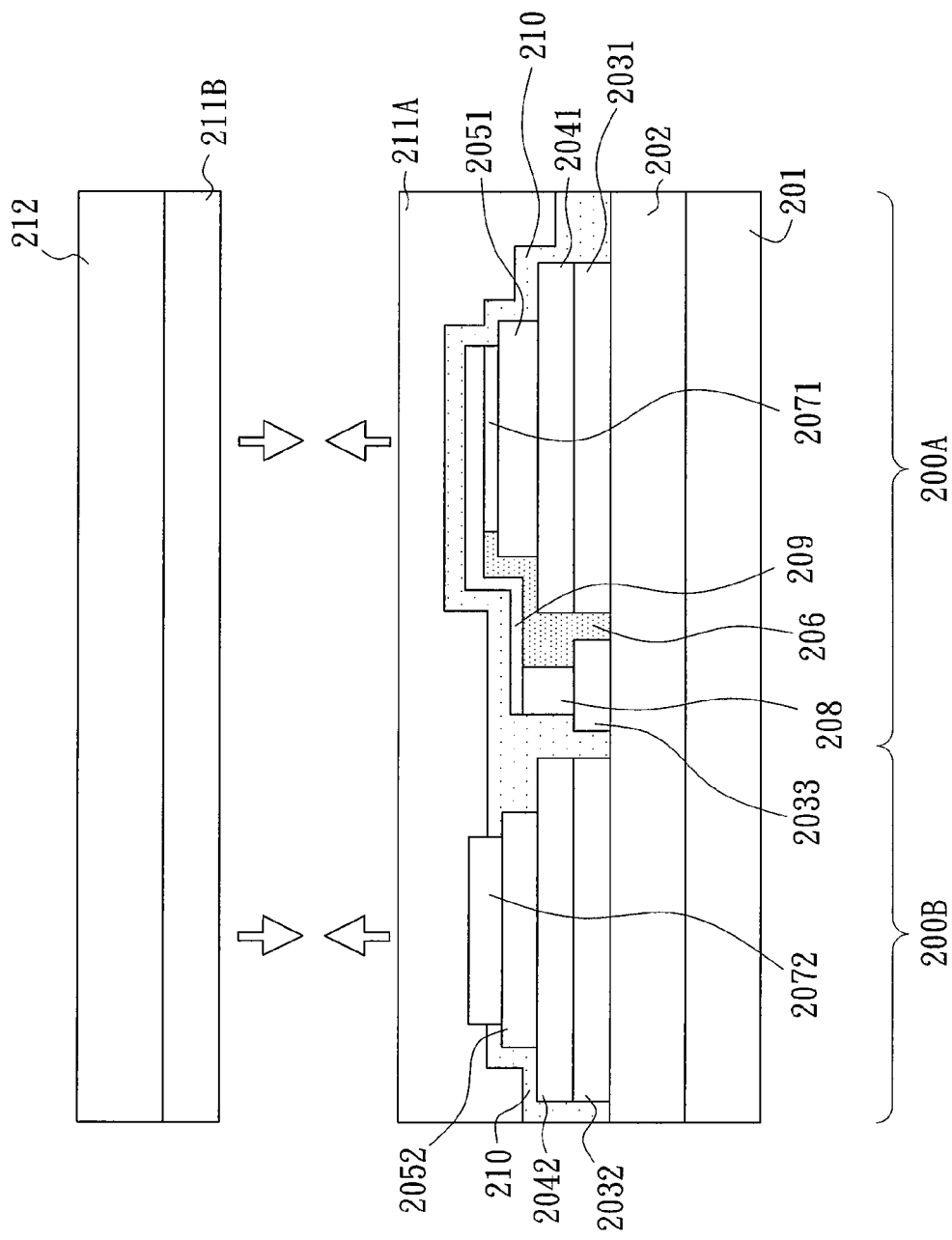

Following, as FIG. 2F shows, a first metal connecting layer 211A is formed on the second insulating layer 210 and the second p-type electrode 2072. Besides, a conductive substrate 212 is provided. A second metal connecting layer 211B is formed on one side of the conductive substrate 212 to bond the first metal connecting layer 211A and the second metal connecting layer 211B.

Following, as FIG. 2G shows, the wafer is flipped over and the temporary substrate 201 is removed. As FIG. 2H shows, the buffer layer 202 is also removed.

Figure 2I:
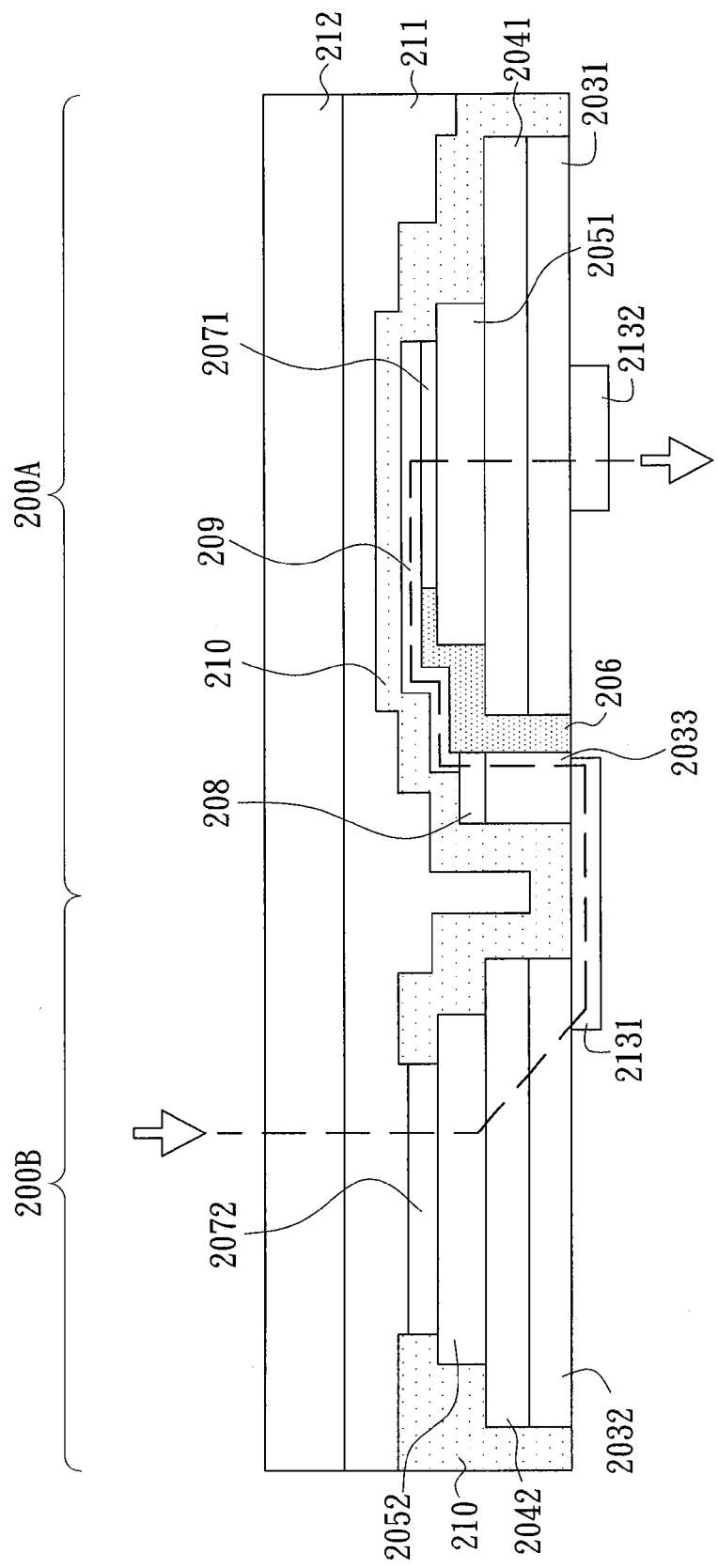

Finally, as FIG. 2I shows, a first electrode 2131 is formed to connect the third n-type semiconductor layer 2033 of the first light emitting stack 200A and the second n-type semiconductor layer 2032 of the second light emitting stack 200B. A second electrode 2032 is formed to connect the first n-type semiconductor layer 2031 of the first light emitting stack 200A. As the arrow in FIG. 2I indicates, the current flows from the second p-type electrode 2072 of the second light emitting stack 200B to the first electrode 2131, then the current flows from the first electrode 2131 to the third n-type semiconductor layer 2033 of the first light emitting stack 200A. Then the current flows through the first n-type electrode 208, the wire 209, and the first p-type electrode 2071 to the second electrode 2032 to form a vertical light emitting array structure in series connection.

Figure 2J:
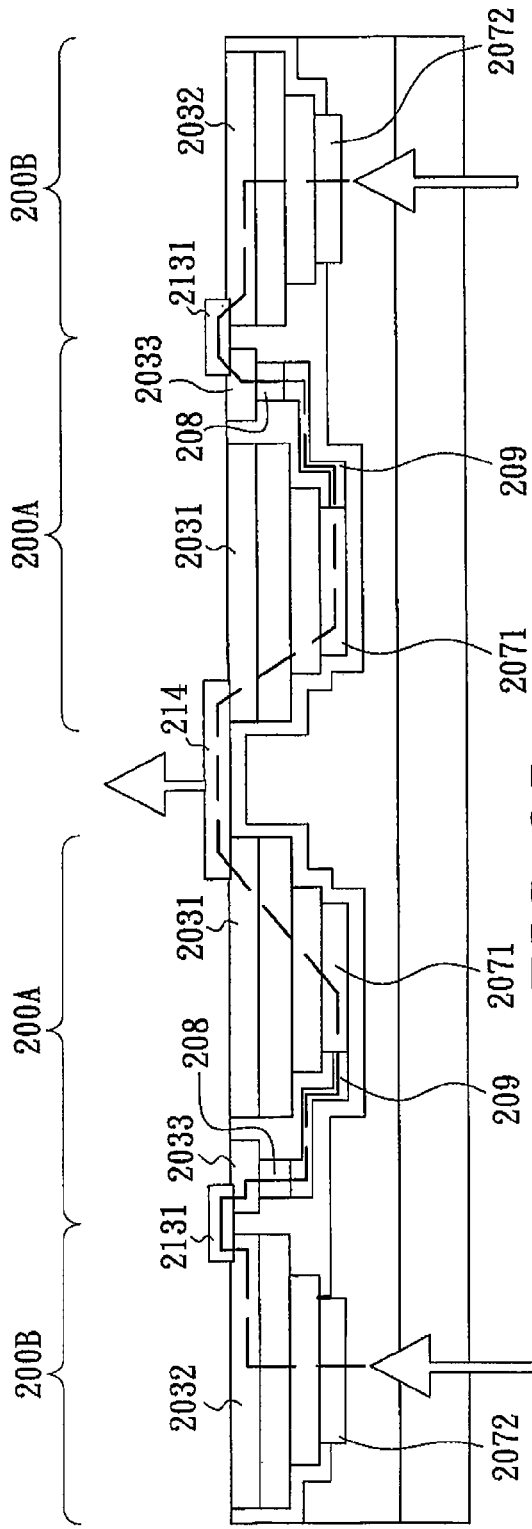
Figure 2K:
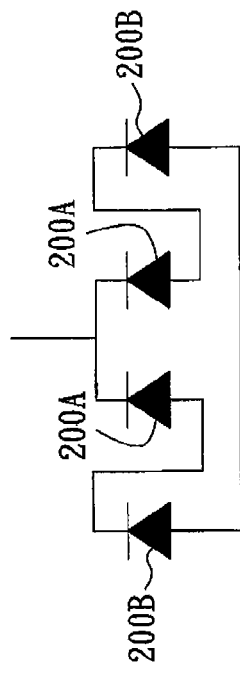

As FIG. 2J shows, by the process described above, another embodiment of the light emitting array of the present disclosure is disclosed. The light emitting array includes a second light emitting stack 200B, a first light emitting stack 200A, wherein the first light emitting stack 200A and the second light emitting stack 200B are orderly formed. In this embodiment, as the arrow indicates, the current flows from the second p-type electrode 2072 to the first electrode 2131 of the second light emitting stack 200B on both sides, then the current flows from the first electrode 2131 to the third n-type semiconductor layer 2033 of the first light emitting stack 200A. Then the current flows through the first n-type electrode 208, the wire 209, and the first p-type electrode 2071 to the third electrode 214 which connects the two first n-type semiconductor layer 2031 of the two first light emitting stack 200A in the middle to form a light emitting array structure with both series and parallel connections. The circuit shown in FIG. 2K has two first light emitting stacks 200A and 200B forming a series connection respectively, and the two series connection structures are connected in parallel connection based on the current flow direction described above.

Besides, the first light emitting stack 200A and the second light emitting stack 200B are flexibly arranged based on the design or fabricating process in the light emitting diode array structure of this disclosure. Based on the direction of current flow, the light emitting diode array structure in this disclosure can be a vertical or horizontal structure in series or parallel connections. Some of the possible structures are shown in the following embodiments.

Figure 3A:
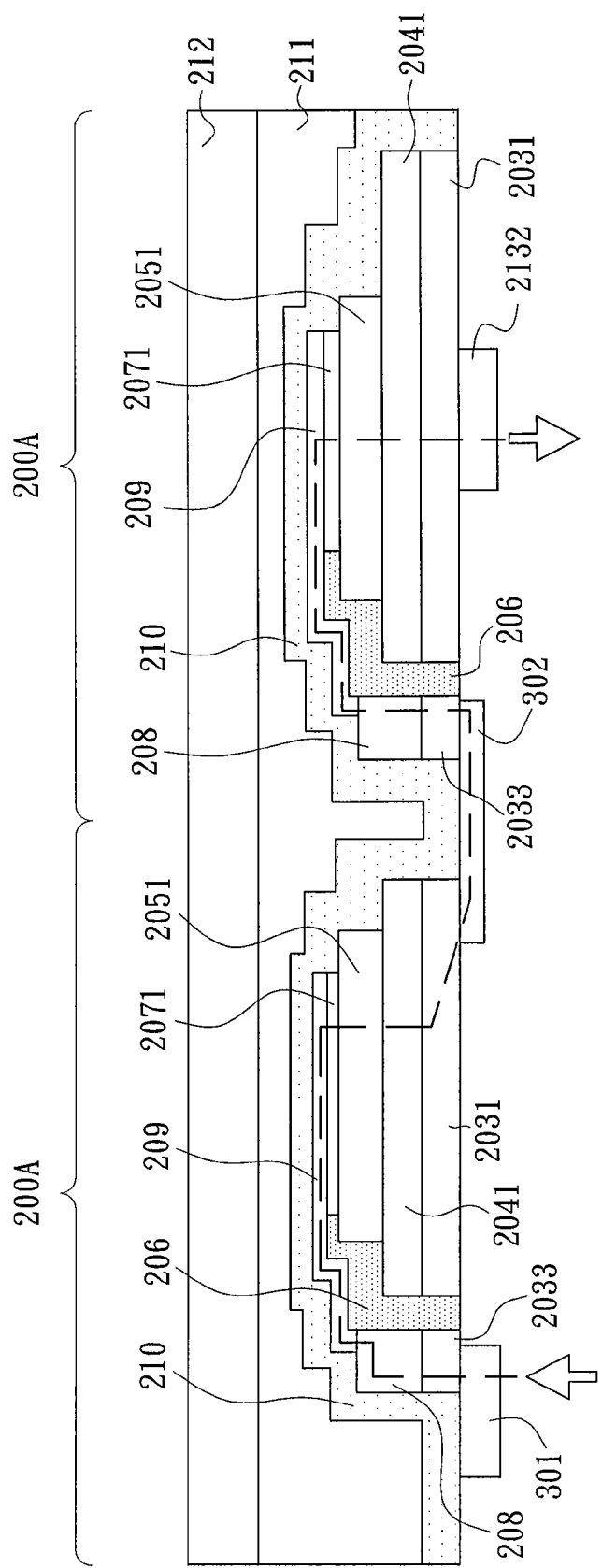
FIGS. 3A to 3B illustrate the structure of another embodiments in the present disclosure.

As shows in FIG. 3A, two of the first light emitting stacks 200A are formed continuously wherein the structure is the same as the one shown in FIG. 2H. A fourth electrode 301 is formed to connect the third n-type semiconductor layer 2033 of the first light emitting stack 200A on the left side. A fifth electrode 302 is formed to connect the first n-type semiconductor layer 2031 of the first light emitting stack 200A on the left side and the third n-type semiconductor layer 2033 of the first light emitting stack 200A on the right side. As the arrow indicates, the current flows from the forth electrode 301 to the third n-type semiconductor layer 2033 of the first light emitting stack 200A on the left side to the first n-type electrode 208, the wire 209, and the first p-type electrode 2071 to the fifth electrode 302 and flows into the third n-type semiconductor layer 2033 of the first light emitting stack 200A on the right side and to the first n-type electrode 208, the wire 209, and the first p-type electrode 2071 to the second electrode 2132 to form a lateral light emitting array structure in series connection.

Figure 3B:
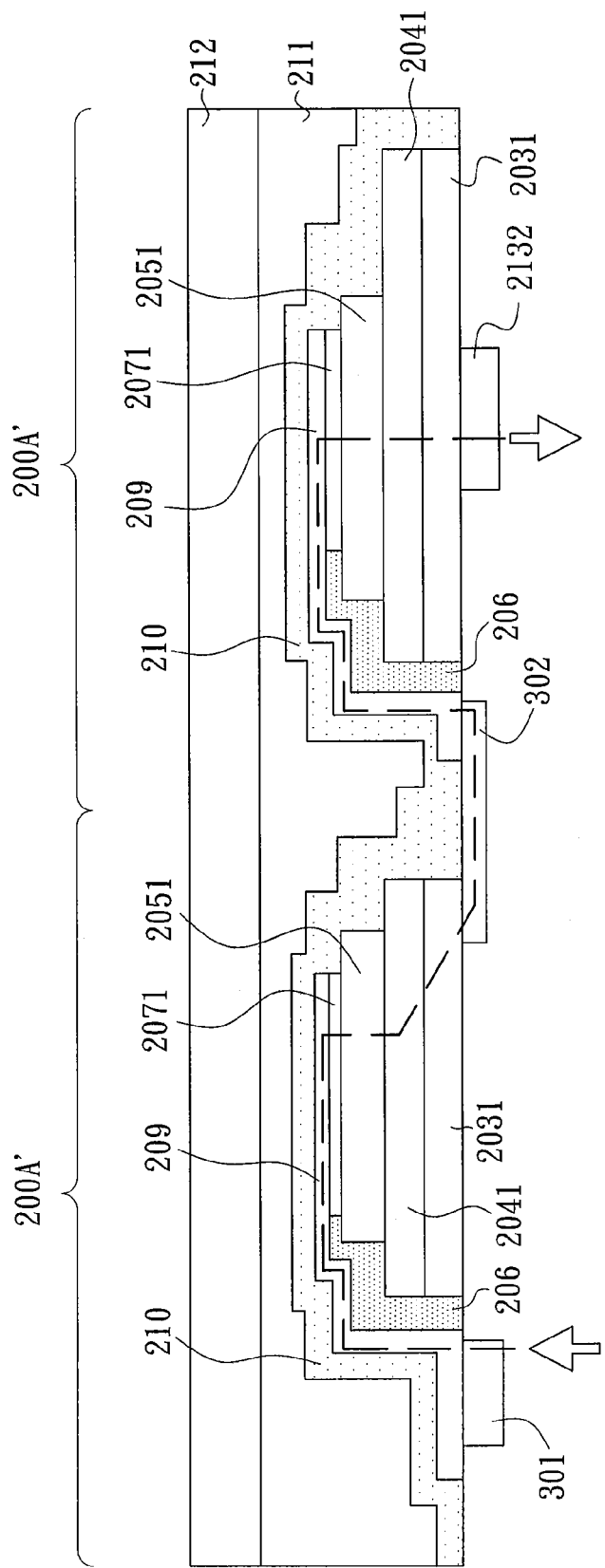

In another embodiment of this disclosure, as shown in FIG. 3B, two of the first light emitting stack 200A' is formed continuously wherein the structure is the same as the one shown in FIG. 2H. However, in this embodiment, the structure of the first light emitting stack 200A' does not comprise the third n-type semiconductor layer 2033 and the first n-type electrode 208. In addition, a fourth electrode 301 is formed to connect the wire 209 of the first light emitting stack 200A' on the left side. A fifth electrode 302 is formed to connect the first n-type semiconductor layer 2031 of the first light emitting stack 200A' on the left side and the wire 209 of the first light emitting stack 200A' on the right side. As the arrow indicates, the current flows from the forth electrode 301 to the wire 209 of the first light emitting stack 200A' on the left side to the fifth electrode 302 and flows into the wire 209 of the first light emitting stack 200A' on the right side and to the first p-type electrode 2071 and the second electrode 2132 to form a lateral light emitting array structure in series connection.

In another embodiment of this disclosure, as shown in FIG. 3B, two of the first light emitting stacks 200A' are formed continuously wherein the structure is the same as the one shown in FIG. 2H. However, in this embodiment, the structure of the first light emitting stack 200A' does not comprise the third n-type semiconductor layer 2033 and the first n-type electrode 208. Furthermore, a fourth electrode 301 is formed to connect the wire 209 of the first light emitting stack 200A' on the left side. A fifth electrode 302 is formed to connect the first n-type semiconductor layer 2031 of the first light emitting stack 200A' on the left side and the wire 209 of the first light emitting stack 200A' on the right side. As the arrow indicates, the current flows from the forth electrode 301 to the wire 209 of the first light emitting stack 200A' on the left side to the fifth electrode 302 and flows into the wire 209 of the first light emitting stack 200A' on the right side and to the first p-type electrode 2071 and the second electrode 2132 to form a lateral light emitting array structure in series connection.

Figure 4:
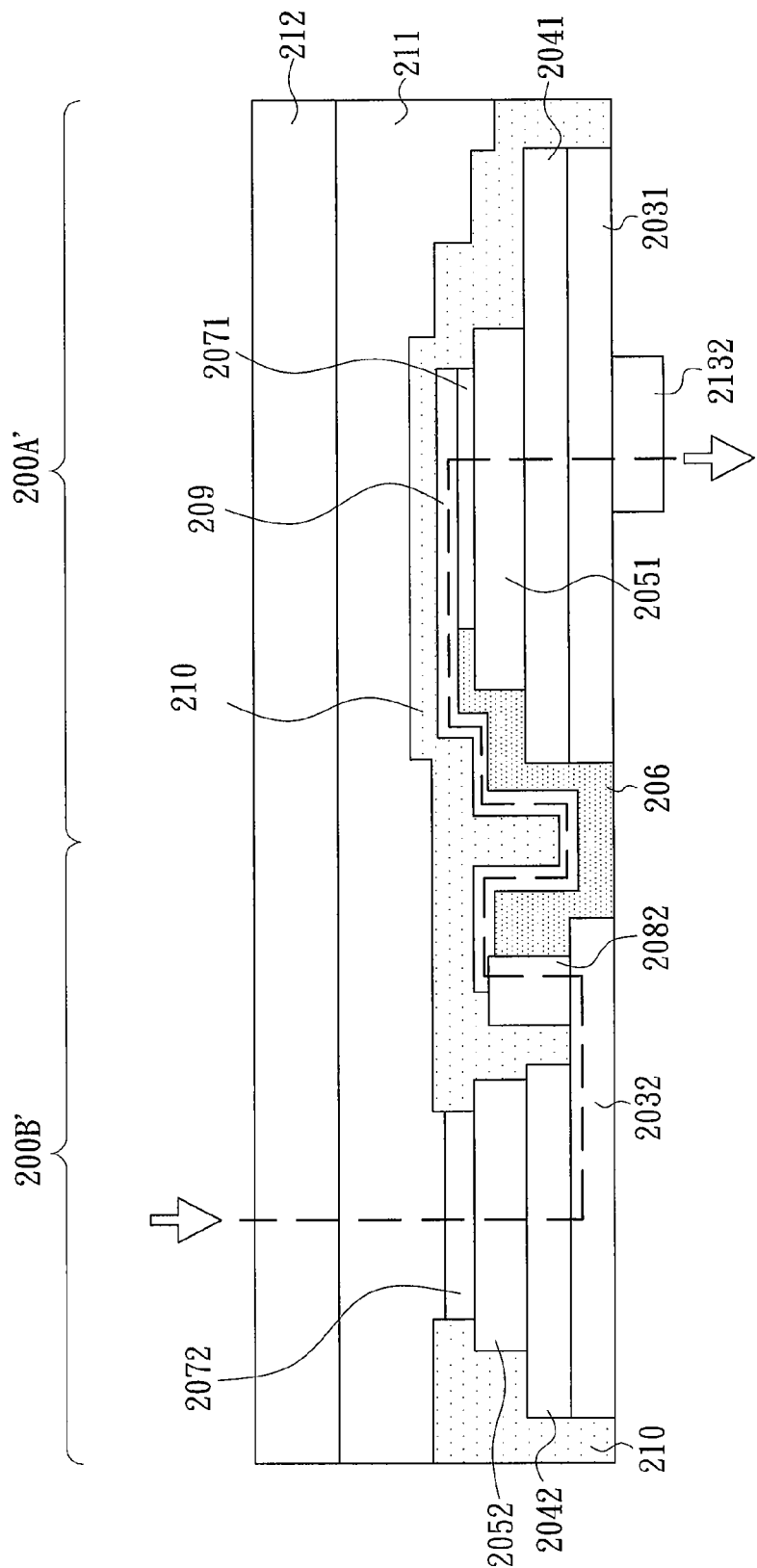
FIG. 4 illustrates the structure of further another embodiment in the present disclosure.

In another embodiment of this disclosure, as shown in FIG. 4, a first light emitting stack 200A' and a second light emitting stack 200B' are alternately formed wherein the structure of the first light emitting stack 200A' and the second light emitting stack 200B' are the same as the one shown in FIG. 2H. However, in this embodiment, the structure of the first light emitting stack 200A' does not comprise the third n-type semiconductor layer 2033 and the first n-type electrode 208. A first n-type electrode 2082 is formed on the second n-type semiconductor layer 2032 of the second light emitting stack 200B'. As the arrow indicates, the current flows from the second p-type electrode 2072 to the second n-type semiconductor layer 2032 and the second n-type electrode of the second light emitting stack 200B' and the current flows through the wire 209 to first p-type electrode 2071 and the second electrode 2132 of the first light emitting stack 200A' to form a vertical light emitting array structure in series connection.

The material of the temporary substrate of the embodiment described above may be a transparent material like sapphire, ZnO, LiAlO$_2$, GaN, AlN, metal, glass, diamond, CVD diamond, Diamond-Like Carbon (DLC), spinel (MgAl$_2$O$_4$), Al$_2$O$_3$, SiO$_x$ or LiGaO$_2$. The temporary substrate of the embodiment described above may be a conductive substrate like Ge, GaAs, InP, SiC, Si, LiAlO$_2$, ZnO, GaN, AlN, ceramic or metal. The material of the buffer layer 202 can be AlN and GaN.

The material of the first light emitting stack 200A and the second light emitting stack 200B contain at least one element selected from the group consisting of Al, Ga, In, As, P, and N, such as GaN, AlGaInP or any other suitable materials. The material of the first insulating layer 206 and the second insulating layer 210 can be SiO$_x$, Al$_2$O$_3$, TiO$_2$, or other oxide material, or Polymer material like Polyimide(PI), Benzocyclobutene(BCB), prefluorocyclobutane (PFCB), spin-on-coating (SOG).

The material of the first p-type electrode 2071, the second p-type electrode 2072, the first n-type electrode 208, the second n-type electrode 2082, the first electrode 2131, the second electrode 2132, the third electrode 214, the fourth electrode 301, the fifth electrode 302 and the wire 209 can be Au, Ag, Al, alloy or multilayered metal structure. The material of the connecting layer 211 can be Au, Ag, Al, In or other metal suitable for connection. The material of the conductive substrate 212 can be Ge, GaAs, InP, SiC, Si, LiAlO$_2$, ZnO, GaN, AlN, ceramic and metal.

It will be apparent to those having ordinary skill in the art that various modifications and variations can be made to the devices in accordance with the present disclosure without departing from the scope or spirit of the disclosure. In view of the foregoing, it is intended that the present disclosure covers modifications and variations of this disclosure provided they fall within the scope of the following claims and their equivalents.

Although the drawings and the illustrations above are corresponding to the specific embodiments individually, the element, the practicing method, the designing principle, and the technical theory can be referred, exchanged, incorporated, collocated, coordinated except they are conflicted, incompatible, or hard to be put into practice together.

Although the present disclosure has been explained above, it is not the limitation of the range, the sequence in practice, the material in practice, or the method in practice. Any modification or decoration for present disclosure is not detached from the spirit and the range of such.

The invention claimed is:

1. A light emitting array structure, comprising:
   a first light emitting stack and a second light emitting stack;
   a first insulating layer on the first light emitting stack;
   a wire on the first insulating layer and electrically connected to the first light emitting stack and the second light emitting stack;
   a second insulating layer on the first light emitting stack, the wire, and the second light emitting stack;
   a metal connecting layer on the second insulating layer and electrically connected to the second light emitting stack;
   a conductive substrate on the metal connecting layer; and
   a first electrode on the first light emitting stack.

2. The light emitting array structure of claim 1, wherein the first light emitting stack and the second light emitting stack is in series connection.

3. The light emitting array structure of claim 1, wherein the first light emitting stack comprising a first first-type semiconductor layer, a first second-type semiconductor layer and a first active layer sandwiched between the first first-type semiconductor layer and the first second-type semiconductor layer; and the second light emitting stack comprising a second first-type semiconductor layer, a second second-type semiconductor layer and a second active layer sandwiched between the second first-type semiconductor layer and the second second-type semiconductor layer.

4. The light emitting array structure of claim 1, wherein the first light emitting stack further comprising a third first-type semiconductor layer wherein the third first-type semiconductor layer is separated from the first first-type semiconductor layer.

5. The light emitting array structure of claim 4, further comprising a third light emitting stack and a fourth light emitting stack, wherein the first light emitting stack is between the second light emitting stack and the third light emitting stack, and the third light emitting stack is between the first light emitting stack and the fourth light emitting stack.

6. The light emitting array structure of claim 5, wherein the third light emitting stack comprises a fourth first-type semiconductor layer and a fifth first-type semiconductor layer, and wherein the fifth first-type semiconductor layer is separated from the fourth first-type semiconductor layer.

7. The light emitting array structure of claim 6, further comprising a third insulating layer on the third light emitting stack;
   a second wire on the third insulating layer and electrically connected to the third light emitting stack and the fourth light emitting stack.

8. The light emitting array structure of claim 7, wherein the second insulating layer is on the first light emitting stack, the third light emitting stack, the first wire, the second wire, the second light emitting stack, and the fourth light emitting stack;
   the metal connecting layer is on the second insulating layer and electrically connecting the second light emitting stack and the fourth light emitting stack.

9. The light emitting array structure of claim 8, wherein the first electrode is electrically connected to the first first-type semiconductor layer of the first light emitting stack and the fourth first-type semiconductor layer of the third light emitting stack.

10. The light emitting array structure of claim 9, further comprising a third electrode electrically connected the sixth first-type semiconductor layer of the fourth light emitting stack and the fifth first-type semiconductor layer of the third light emitting stack.

11. The light emitting array structure of claim 5, wherein the first light emitting stack and the second light emitting stack forms a first series connection structure, and the third light emitting stack and the fourth light emitting stack forms a second series connection structure.

12. The light emitting array structure of claim 11, wherein the first series connection structure and the second series connection structure forms a parallel connection structure.

13. The light emitting array structure, comprising:
a first light emitting stack and a second light emitting stack;
a first insulating layer on the first light emitting stack and the second light emitting stack;
a first wire on the first insulating layer and the first light emitting stack;
a second wire on the first insulating layer and the second light emitting stack;
a second insulating layer on the first light emitting stack, the second light emitting stack, the first wire, and the second wire;
a metal connecting layer on the second insulating layer;
a conductive substrate on the metal connecting layer; and
a first electrode electrically connected the first light emitting stack and the second light emitting stack.

14. The light emitting array structure of claim 13, wherein the first light emitting stack and the second light emitting stack is in series connection.

15. The light emitting array structure of claim 13, wherein the first light emitting stack comprises a first first-type semiconductor layer, a first second-type semiconductor layer and a first active layer sandwiched between the first first-type semiconductor layer and the first second-type semiconductor layer; and the second light emitting stack comprises a second first-type semiconductor layer, a second second-type semiconductor layer and a second active layer sandwiched between the second first-type semiconductor layer and the second second-type semiconductor layer.

16. The light emitting array structure of claim 15, wherein the first light emitting stack further comprises a third first-type semiconductor layer separated from first-type semiconductor layer; and wherein the second light emitting stack further comprises a fourth first-type semiconductor layer separated from the second first-type semiconductor layer.

17. The light emitting array structure of claim 16, wherein the first electrode is formed on the second first-type semiconductor layer and the third first-type semiconductor layer.

18. The light emitting array structure of claim 16, further comprising a second electrode on the fourth first-type semiconductor layer.

19. The light emitting array structure of claim 16, further comprising a third electrode on the first first-type semiconductor layer.

* * * * *